US012700532B2

(12) United States Patent
Okumura et al.

(10) Patent No.: US 12,700,532 B2
(45) Date of Patent: Aug. 4, 2026

(54) COMMON MODE FILTER

(71) Applicant: TDK Corporation, Tokyo (JP)

(72) Inventors: Takeshi Okumura, Tokyo (JP); Kouji Kawamura, Tokyo (JP); Hidenori Tsutsui, Tokyo (JP); Hiroshi Sagawa, Tokyo (JP); Kenichi Ichinose, Tokyo (JP); Taichi Hirose, Tokyo (JP); Hiromu Sakamoto, Tokyo (JP)

(73) Assignee: TDK Corporation, Tokyo (JP)

( * ) Notice: Subject to any disclaimer, the term of this patent is extended or adjusted under 35 U.S.C. 154(b) by 855 days.

(21) Appl. No.: 18/163,500

(22) Filed: Feb. 2, 2023

(65) Prior Publication Data

US 2023/0253141 A1 Aug. 10, 2023

(30) Foreign Application Priority Data

Feb. 9, 2022 (JP) ................................. 2022-018532

(51) Int. Cl.
| | |
|---|---|
| *H01F 27/28* | (2006.01) |
| *H01F 27/29* | (2006.01) |
| *H03H 7/01* | (2006.01) |

(52) U.S. Cl.
CPC ....... *H01F 27/2804* (2013.01); *H01F 27/292* (2013.01); *H03H 7/0153* (2013.01); *H01F 2027/2809* (2013.01)

(58) Field of Classification Search
CPC ............... H01F 27/2804; H01F 27/292; H01F 2027/2809
USPC ....................................................... 336/200
See application file for complete search history.

(56) References Cited

U.S. PATENT DOCUMENTS

| | | | | |
|---|---|---|---|---|
| 7,145,427 B2 * | 12/2006 | Yoshida | ............. | H01F 17/0013 336/200 |
| 7,477,127 B2 * | 1/2009 | Kamijima | ............ | H01F 41/041 336/206 |
| 7,692,527 B2 * | 4/2010 | Ito | ....................... | H01F 17/0013 336/200 |
| 7,772,956 B2 * | 8/2010 | Toi | ........................ | H01F 19/06 336/200 |
| 7,947,428 B2 * | 5/2011 | Kamijima | .......... | H01F 17/0006 430/311 |
| 8,471,668 B2 * | 6/2013 | Hsieh | ................. | H01F 17/0013 336/200 |
| 8,957,744 B2 * | 2/2015 | Yoshino | ................ | H03H 7/427 336/200 |

(Continued)

FOREIGN PATENT DOCUMENTS

| | | |
|---|---|---|
| JP | 2019036698 A | 3/2019 |

*Primary Examiner* — Shawki S Ismail
*Assistant Examiner* — Joselito S. Baisa
(74) *Attorney, Agent, or Firm* — Rimon P.C.

(57) ABSTRACT

Disclosed herein is a common mode filter that includes: a first conductor layer including a first coil pattern, a first connection pattern, and a first lead-out pattern connecting the first coil pattern and the first connection pattern; and a second conductor layer including a second coil pattern, a second connection pattern, and a second lead-out pattern connecting the second coil pattern and the second connection pattern. The extending direction of the first section of the first lead-out pattern and an extending direction of the second section of the second lead-out pattern are opposed to each other. The first section is longer than the second section. The second coil pattern is larger in diameter than the first coil pattern.

10 Claims, 9 Drawing Sheets

(56)  References Cited

U.S. PATENT DOCUMENTS

| 10,062,493 | B2 * | 8/2018 | Chang | H01F 27/2804 |
|---|---|---|---|---|
| 2003/0052766 | A1 * | 3/2003 | Tomohiro | H01F 17/0013 |
| | | | | 336/200 |
| 2004/0130415 | A1 * | 7/2004 | Chiba | H01F 17/0013 |
| | | | | 333/185 |
| 2014/0368307 | A1 * | 12/2014 | Kato | H01F 27/343 |
| | | | | 336/200 |
| 2017/0345550 | A1 | 11/2017 | Sasaki | |
| 2020/0052673 | A1 * | 2/2020 | Sasaki | H03H 7/09 |

* cited by examiner

COMMON MODE FILTER

CROSS-REFERENCE TO RELATED APPLICATION

The present application claims priority from Japanese Application JP 2022-018532 filed on Feb. 9, 2022, the content to which is hereby incorporated by reference into this application.

BACKGROUND OF THE ART

Field of the Art

The present invention relates to a common mode filter and, more particularly, to a chip-type common mode filter to be surface-mounted.

Description of Related Art

JP 2019-036698A discloses a common mode filter having a structure in which a plurality of conductor layers are stacked. The common mode filter disclosed in JP 2019-036698A has four conductor layers, and the outer peripheral end of a coil pattern formed in each of the conductor patterns is connected to a corresponding terminal electrode.

However, in the pattern shapes illustrated in FIGS. 3 and 4 of JP 2019-036698A, a slight difference occurs in the number of turns between a pair of lines to disadvantageously cause a difference in inductance or resistance between the pair of lines. On the other hand, in the pattern shape illustrated in FIG. 6 of JP 2019-036698A, the number of turns can be made substantially the same between the pair of lines; however, a lead-out pattern included in one of the pair of lines extends in a long distance in an opposite direction to the corresponding coil pattern, thus posing a problem that inductance becomes unbalanced between the pair of lines.

SUMMARY

It is therefore an object of the present invention to provide a common mode filter with high symmetry between a pair of lines.

A common mode filter according to the present invention incudes: first and second terminal electrodes; a first conductor layer including a first coil pattern, a first connection pattern connected to the first terminal electrode, and a first lead-out pattern connecting the outer peripheral end of the first coil pattern and the first connection pattern; and a second conductor layer including a second coil pattern, a second connection pattern connected to the second terminal electrode, and a second lead-out pattern connecting the outer peripheral end of the second coil pattern and the second connection pattern. The first and second connection patterns are arranged in a first direction as viewed in the stacking direction of the first and second conductor layers. The winding direction of the first coil pattern from the outer peripheral end thereof toward the inner peripheral end of the same and the winding direction of the second coil pattern from the outer peripheral end thereof toward the inner peripheral end of the same are the same. The first lead-out pattern includes a first section extending in the first direction from the first connection pattern, and the second lead-out pattern includes a second section extending in the first direction from the second connection pattern. The extending direction of the first section from the first connection pattern toward the outer peripheral end of the first coil pattern and the extending direction of the second section from the second connection pattern toward the outer peripheral end of the second coil pattern are opposed to each other. The first section is longer than the second section. The second coil pattern is larger in diameter than the first coil pattern.

BRIEF DESCRIPTION OF THE DRAWINGS

The above features and advantages of the present disclosure will be more apparent from the following description of certain preferred embodiments taken in conjunction with the accompanying drawings, in which.

DETAILED DESCRIPTION OF THE EMBODIMENTS

Preferred embodiments of the present disclosure will now be explained in detail with reference to the drawings.

Figure 1:
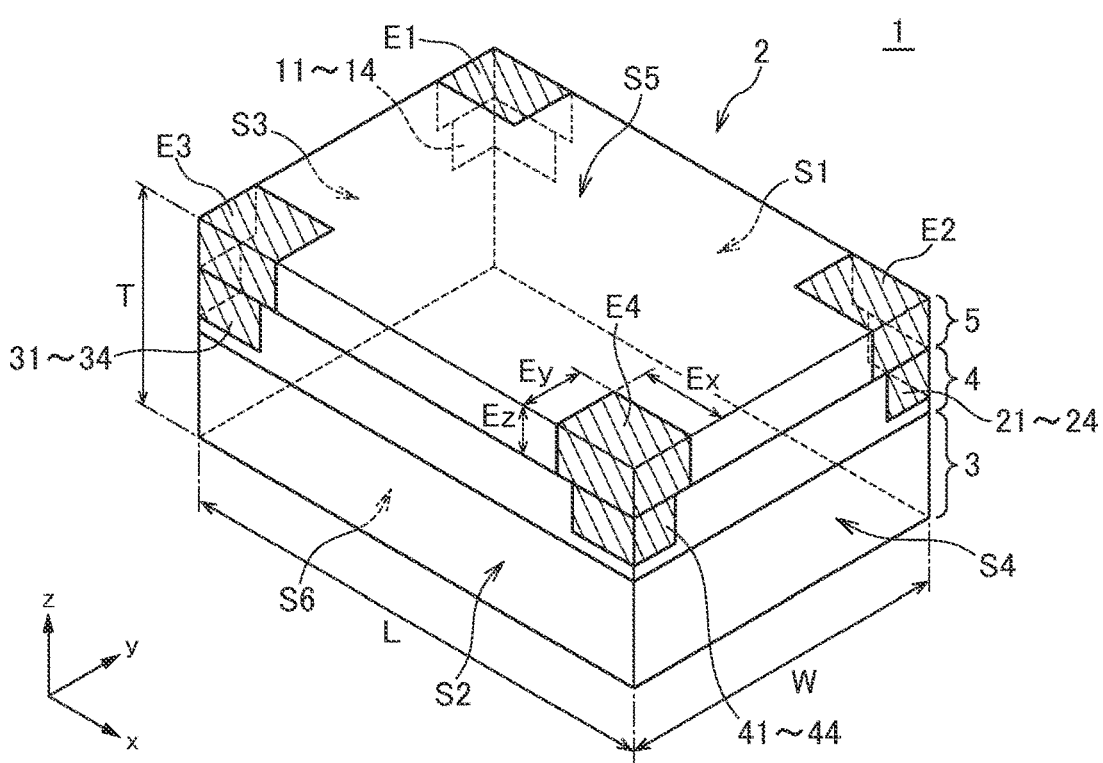
FIG. 1 is a schematic perspective view illustrating the outer appearance of a common mode filter 1 according to an embodiment of the present invention.

FIG. 1 is a schematic perspective view illustrating the outer appearance of a common mode filter 1 according to an embodiment of the present invention.

As illustrated in FIG. 1, the common mode filter 1 according to the present embodiment includes a base 2 and four terminal electrodes E1 to E4 embedded in the base 2. The base 2 has a support 3 made of a high permeability material such as ferrite, a coil layer 4 stacked on the support 3, and a magnetic material layer 5 stacked on the coil layer 4. The coil layer 4 has a structure in which insulating layers and conductor layers are alternately stacked in the z-direction, and the conductor layers each have a coil pattern to be described later. The magnetic material layer 5 may be made of a composite magnetic material obtained by mixing magnetic powder (ferrite, permalloy, etc.) and resin. The terminal electrodes E1 to E4 are embedded in the magnetic material layer 5, and the surfaces thereof are partly exposed from the base 2.

The base 2 has a substantially rectangular parallelepiped shape and has a mounting surface S5 and a top surface S6 which constitute the xy surface and are positioned on the mutually opposite sides, side surfaces S1 and S2 constituting the xz surface and positioned on the mutually opposite sides, and side surfaces S3 and S4 constituting the yz surface and positioned on the mutually opposite sides. The mounting surface S5 and top surface S6 are perpendicular to the z-direction (stacking direction).

As illustrated in FIG. 1, the terminal electrode E1 is exposed to the mounting surface S5 and the corner portion between the side surfaces S1 and S3. The terminal electrode E2 is exposed to the mounting surface S5 and the corner portion between the side surfaces S1 and S4. The terminal electrode E3 is exposed to the mounting surface S5 and the corner portion between the side surfaces S2 and S3. The terminal electrode E4 is exposed to the mounting surface S5 and the corner portion between the side surfaces S2 and S4.

Further, connection patterns included in the coil layer 4 are exposed from the side surfaces S1 to S4. Specifically, connection patterns 11 to 14 are exposed to the side surfaces S1 and S3 to overlap the terminal electrode E1 and to be connected thereto. Connection patterns 21 to 24 are exposed to the side surfaces S1 and S4 to overlap the terminal electrode E2 and to be connected thereto. Connection patterns 31 to 34 are exposed to the side surfaces S2 and S3 to overlap the terminal electrode E3 and to be connected thereto. Connection patterns 41 to 44 are exposed to the side surfaces S2 and S4 to overlap the terminal electrode E4 and to be connected thereto.

The following describes the configurations of respective layers constituting the coil layer 4.

Figure 2:
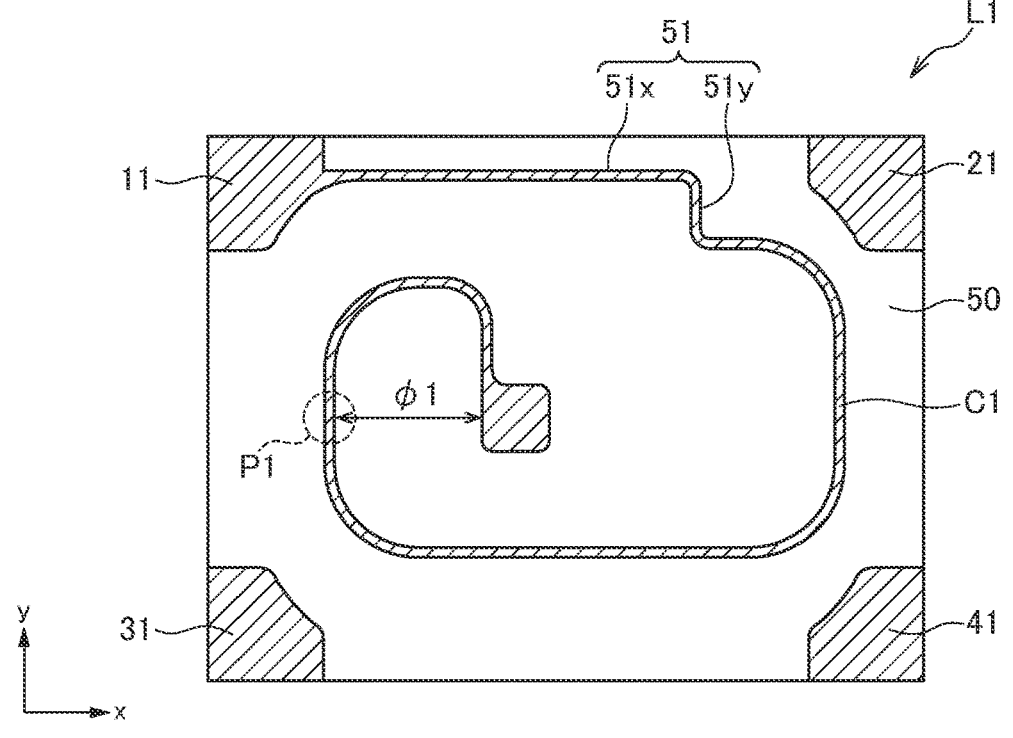
FIG. 2 is a schematic plan view for explaining a pattern shape of a conductor layer L1.

The coil layer 4 has a structure in which insulating layers 50, 60, 70, 80, and 90 and conductor layers L1 to L4 illustrated in FIGS. 2 to 9 are alternately stacked on the surface of the support 3. As illustrated in FIG. 2, the insulating layer 50 is a layer covering the xy surface of the support 3, and the conductor layer L1 is formed on the surface of the insulating layer 50. The conductor layer L1 has a spirally wound coil pattern C1, connection patterns 11, 21, 31, and 41, and a lead-out pattern 51. The coil pattern C1 is wound clockwise from the outer peripheral end to the inner peripheral end. The outer peripheral end of the coil pattern C1 is connected to the connection pattern 11 through the lead-out pattern 51. The other connection patterns 21, 31, and 41 are not connected to the coil pattern C1 but are each provided as an independent conductor pattern within the surface of the conductor layer L1. The connection patterns 11, 21, 31, and 41 are disposed at positions overlapping the terminal electrodes E1, E2, E3 and, E4, respectively. The connection patterns 11 and 21 are arranged in the x-direction as viewed in the z-direction, the connection patterns 31 and 41 are arranged in the x-direction as viewed in the z-direction, the connection patterns 11 and 31 are arranged in the y-direction as viewed in the z-direction, and the connection patterns 21 and 41 are arranged in the y-direction as viewed in the z-direction. The lead-out pattern 51 includes a section 51x extending in the x-direction and a section 51y extending in the y-direction. The section 51x is connected to the connection pattern 11, and the section 51y is connected to the outer peripheral end of the coil pattern C1.

Figure 3:
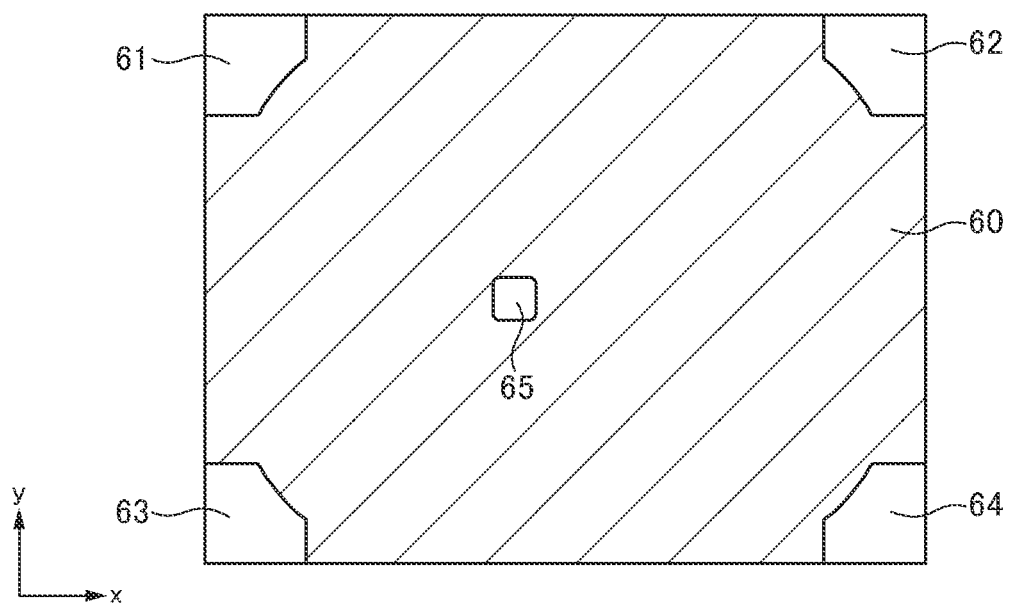
FIG. 3 is a schematic plan view for explaining a pattern shape of a insulating layer 60.

The conductor layer L1 is covered with the insulating layer 60 illustrated in FIG. 3. The insulating layer 60 has openings 61 to 65. The openings 61, 62, 63, and 64 are formed at positions overlapping the connection patterns 11, 21, 31, and 41, respectively. The opening 65 is formed at a position overlapping the inner peripheral end of the coil pattern C1.

Figure 4:
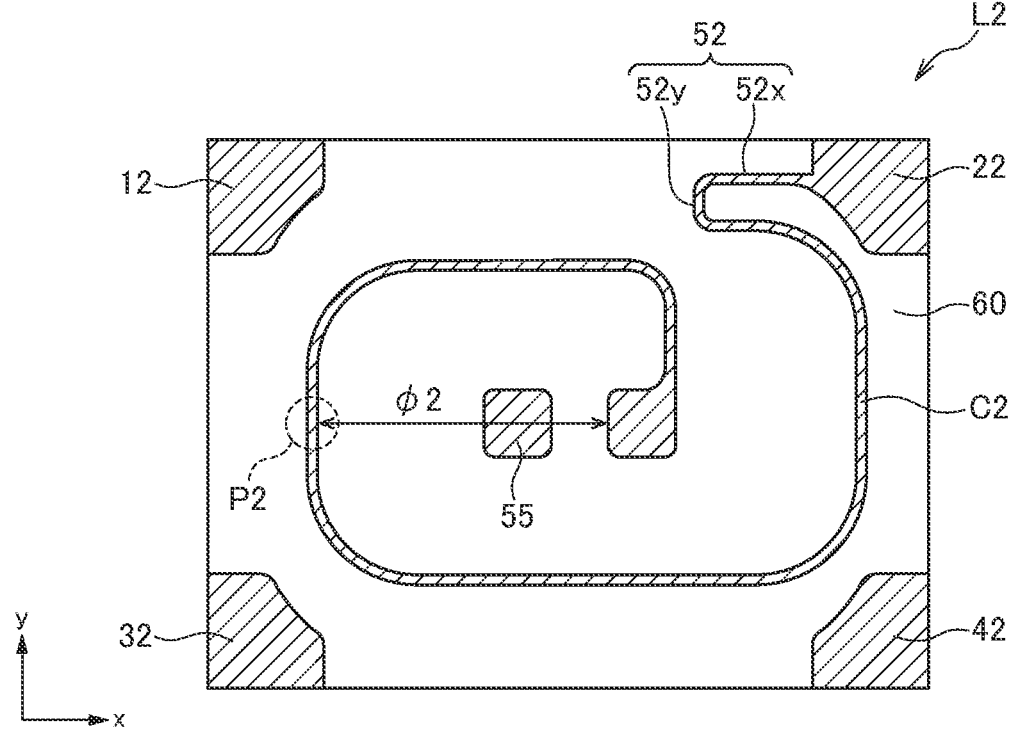
FIG. 4 is a schematic plan view for explaining a pattern shape of a conductor layer L2.

The conductor layer L2 illustrated in FIG. 4 is formed on the surface of the insulating layer 60. The conductor layer L2 has a spirally wound coil pattern C2, connection patterns 12, 22, 32, and 42, a lead-out pattern 52, and a relay pattern 55. The coil pattern C2 is wound clockwise from the outer peripheral end to the inner peripheral end. The outer peripheral end of the coil pattern C2 is connected to the connection pattern 22 through the lead-out pattern 52. Other connection patterns 12, 32, and 42 and relay pattern 55 are not connected to the coil pattern C2 but are each provided as an independent conductor pattern within the surface of the conductor layer L2. The lead-out pattern 52 includes a section 52x extending in the x-direction and a section 52y extending in the y-direction. The section 52x is connected to the connection pattern 22, and the section 52y is connected to the outer peripheral end of the coil pattern C2. The connection patterns 12, 22, 32, and 42 are connected to the connection patterns 11, 21, 31, and 41 of the conductor layer L1, respectively, through the respectively corresponding openings 61, 62, 63, and 64 formed in the insulating layer 60. The relay pattern 55 is connected to the inner peripheral end of the coil pattern C1 through the opening 65 formed in the insulating layer 60.

Figure 5:
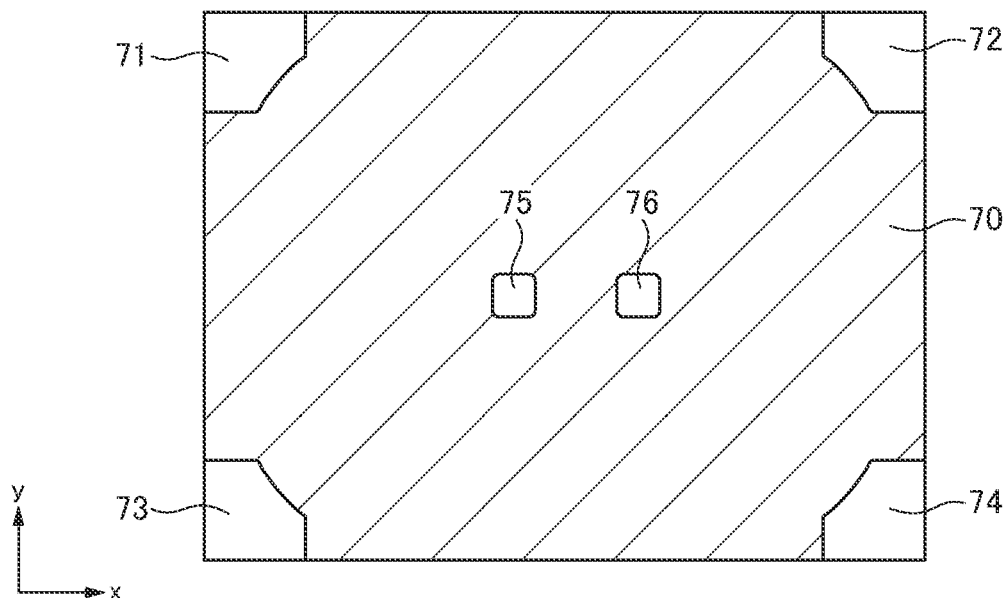
FIG. 5 is a schematic plan view for explaining a pattern shape of a insulating layer 70.

The conductor layer L2 is covered with the insulating layer 70 illustrated in FIG. 5. The insulating layer 70 has openings 71 to 76. The openings 71, 72, 73, and 74 are formed at positions overlapping the connection patterns 12, 22, 32, and 42, respectively. The opening 75 is formed at a position overlapping the relay pattern 55. The opening 76 is formed at a position overlapping the inner peripheral end of the coil pattern C2.

Figure 6:
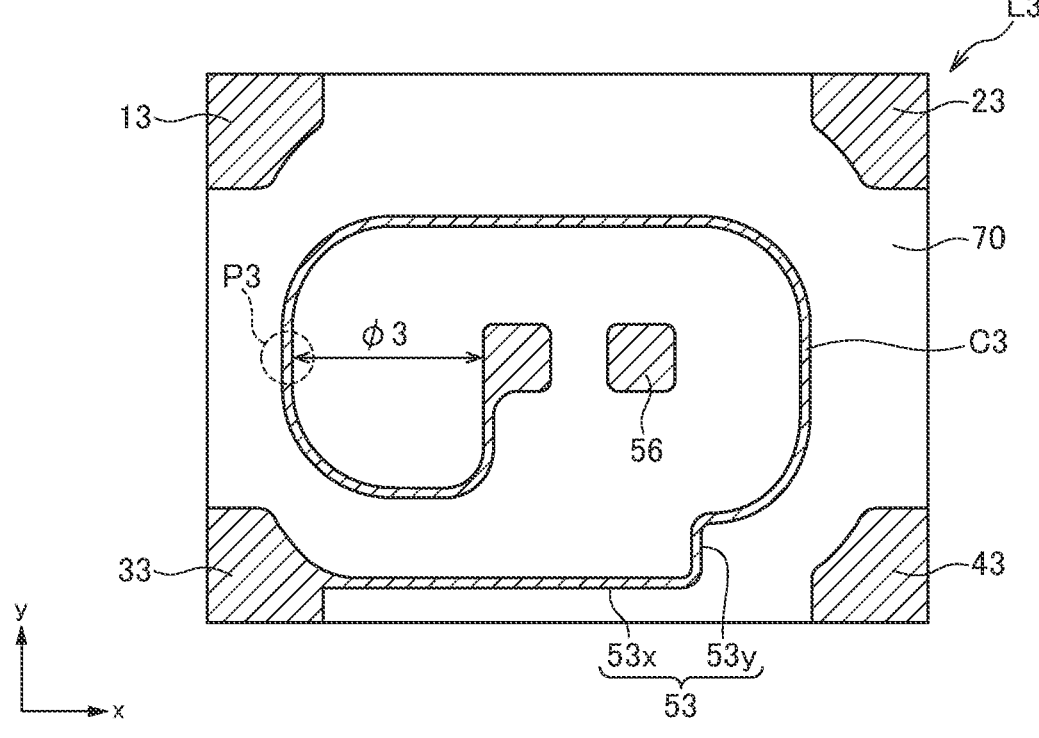
FIG. 6 is a schematic plan view for explaining a pattern shape of a conductor layer L3.

The conductor layer L3 illustrated in FIG. 6 is formed on the surface of the insulating layer 70. The conductor layer L3 has a spirally wound coil pattern C3, connection patterns 13, 23, 33, and 43, a lead-out pattern 53, and a relay pattern 56. The coil pattern C3 is wound clockwise from the inner peripheral end to the outer peripheral end. The outer peripheral end of the coil pattern C3 is connected to the connection pattern 33 through the lead-out pattern 53. Other connection patterns 13, 23, and 43 and relay pattern 56 are not connected to the coil pattern C3 but are each provided as an independent conductor pattern within the surface of the conductor layer L3. The lead-out pattern 53 includes a section 53x extending in the x-direction and a section 53y extending in the y-direction. The section 53x is connected to the connection pattern 33, and the section 53y is connected to the outer peripheral end of the coil pattern C3. The connection patterns 13, 23, 33, and 43 are connected to the connection patterns 12, 22, 32, and 42 of the conductor layer L2, respectively, through the respectively corresponding openings 71, 72, 73, 74 formed in the insulating layer 70. The inner peripheral end of the coil pattern C3 is connected to the relay pattern 55 through the opening 75. As a result, the inner peripheral end of the coil pattern C3 and the inner peripheral end of the coil pattern C1 are connected to each other through the relay pattern 55. The relay pattern 56 is connected to the inner peripheral end of the coil pattern C2 through the opening 76 formed in the insulating layer 70.

Figure 7:
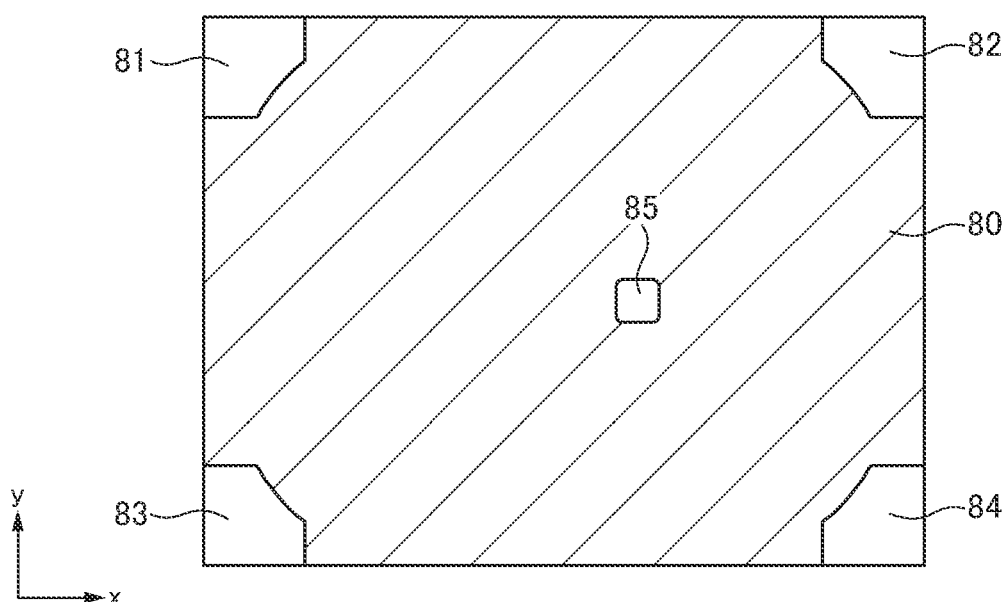
FIG. 7 is a schematic plan view for explaining a pattern shape of a insulating layer 80.

The conductor layer L3 is covered with the insulating layer 80 illustrated in FIG. 7. The insulating layer 80 has openings 81 to 85. The openings 81, 82, 83, and 84 are formed at positions overlapping the connection patterns 13, 23, 33, and 43, respectively. The opening 85 is formed at a position overlapping the relay pattern 56.

Figure 8:
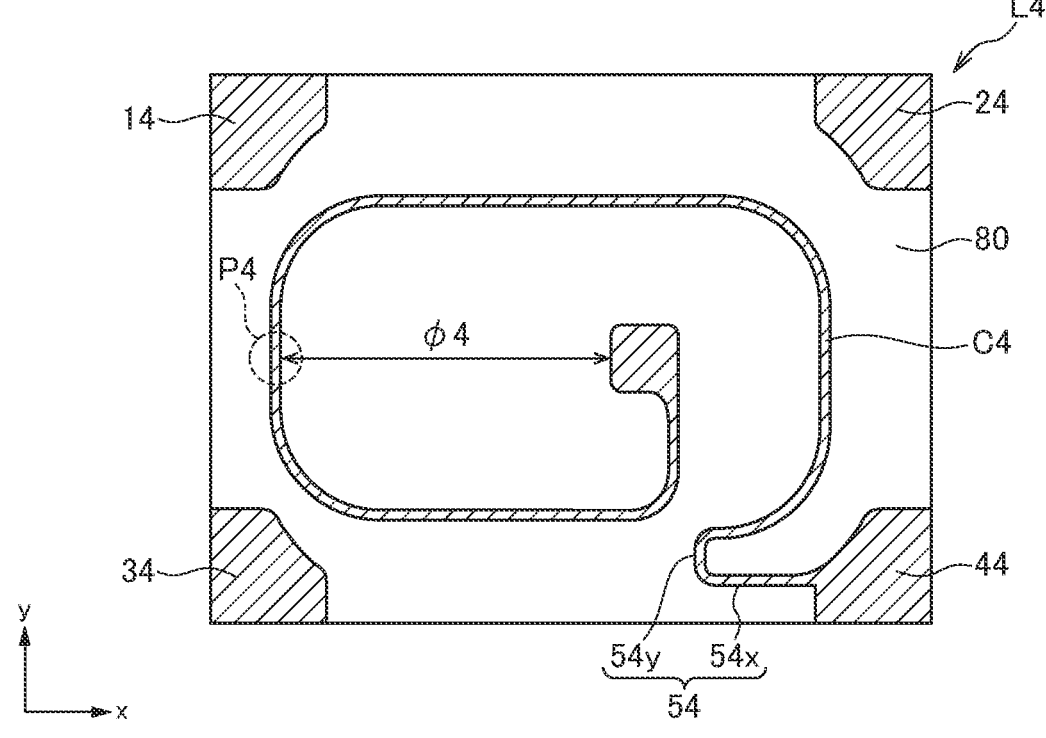
FIG. 8 is a schematic plan view for explaining a pattern shape of a conductor layer L4.

The conductor layer L4 illustrated in FIG. 8 is formed on the surface of the insulating layer 80. The conductor layer L4 has a spirally wound coil pattern C4, connection patterns 14, 24, 34, and 44, and a lead-out pattern 54. The coil pattern C4 is wound clockwise from the inner peripheral end to the outer peripheral end. The outer peripheral end of the coil pattern C4 is connected to the connection pattern 44 through the lead-out pattern 54. The other connection patterns 14, 24, and 34 are not connected to the coil pattern C4 but are each provided as an independent conductor pattern within the surface of the conductor layer L4. The lead-out pattern 54 includes a section 54x extending in the x-direction and a section 54y extending in the y-direction. The section 54x is connected to the connection pattern 44, and the section 54y is connected to the outer peripheral end of the coil pattern C4. The connection patterns 14, 24, 34, and 44 are connected to the connection patterns 13, 23, 33, and 43 of the conductor layer L3, respectively, through the respectively corresponding openings 81, 82 83, and 84 formed in the insulating layer 80. The inner peripheral end of the coil pattern C4 is connected to the relay pattern 56 through the opening 85. As a result, the inner peripheral end of the coil pattern C4 and the inner peripheral end of the coil pattern C2 are connected to each other through the relay pattern 56.

Figure 9:
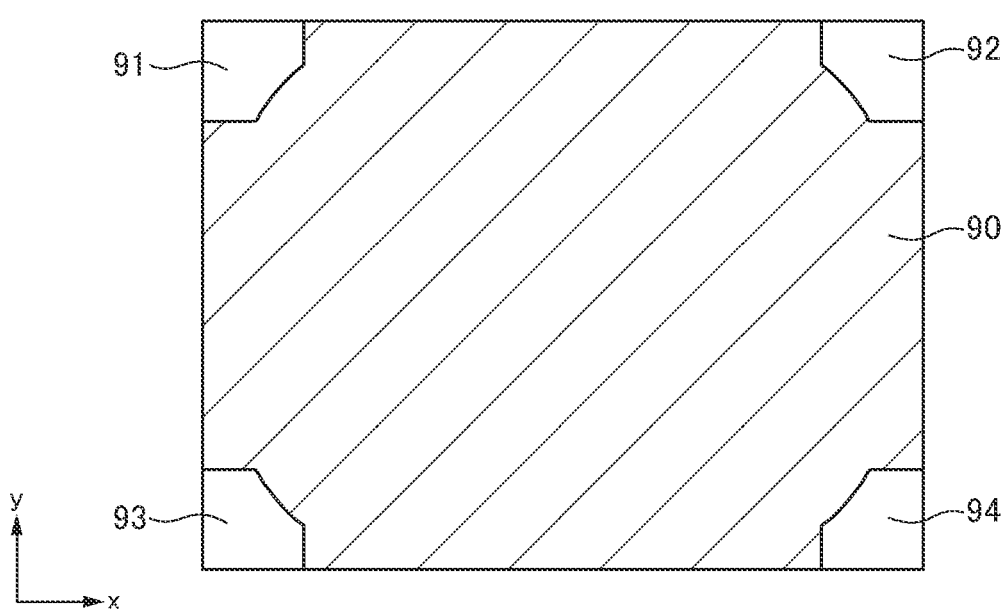
FIG. 9 is a schematic plan view for explaining a pattern shape of a insulating layer 90.

The conductor layer L4 is covered with the insulating layer 90 illustrated in FIG. 9. The insulating layer 90 has openings 91 to 94. The openings 91, 92, 93, and 94 are formed at positions overlapping the connection patterns 14, 24, 34, and 44, respectively.

Figure 10:
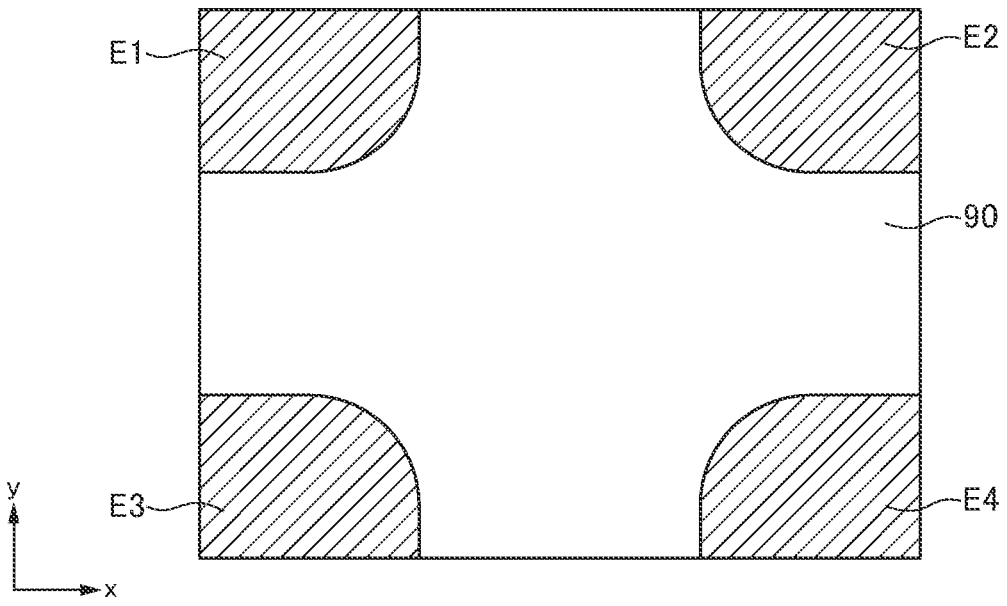
FIG. 10 is a schematic plan view for explaining a pattern shape of terminal electrodes E1 to E4.

The terminal electrodes E1 to E4 illustrated in FIG. 10 are formed on the surface of the insulating layer 90. The terminal electrodes E1, E2, E3 and, E4 are connected to the connection patterns 14, 24, 34, and 44 of the conductor layer L4, respectively, through the respectively corresponding openings 91, 92, 93, and 94. As a result, the coil patterns C1 and C3 are connected in series between the terminal electrodes E1 and E3, and the coil patterns C2 and C4 are connected in series between the terminal electrodes E2 and E4. Since the coil patterns C1 to C4 are stacked in this order in the z-direction, strong magnetic coupling can be achieved between an inductor constituted by the coil patterns C1 and C3 and an inductor constituted by the coil patterns C2 and C4. Further, the magnetic material layer 5 illustrated in FIG. 1 is formed on a part of the surface of the insulating layer 90 at which the terminal electrodes E1 to E4 are not formed.

Figure 11:
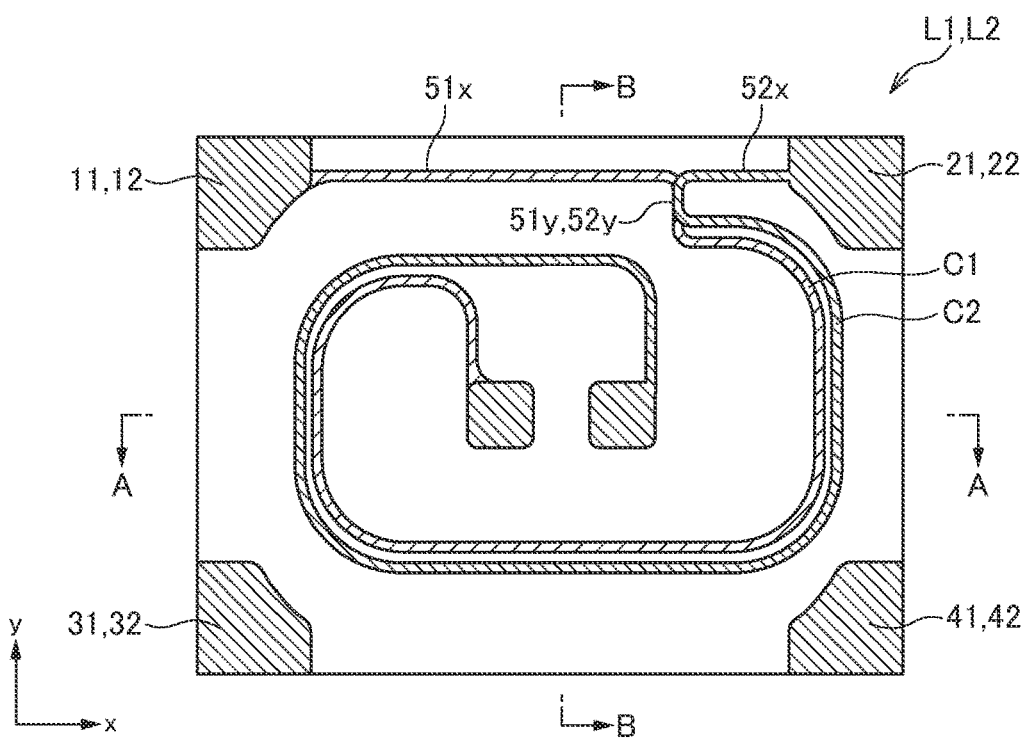
FIG. 11 is a schematic plan view illustrating a state where the conductor layers L1 and L2 overlap each other.
Figure 12:
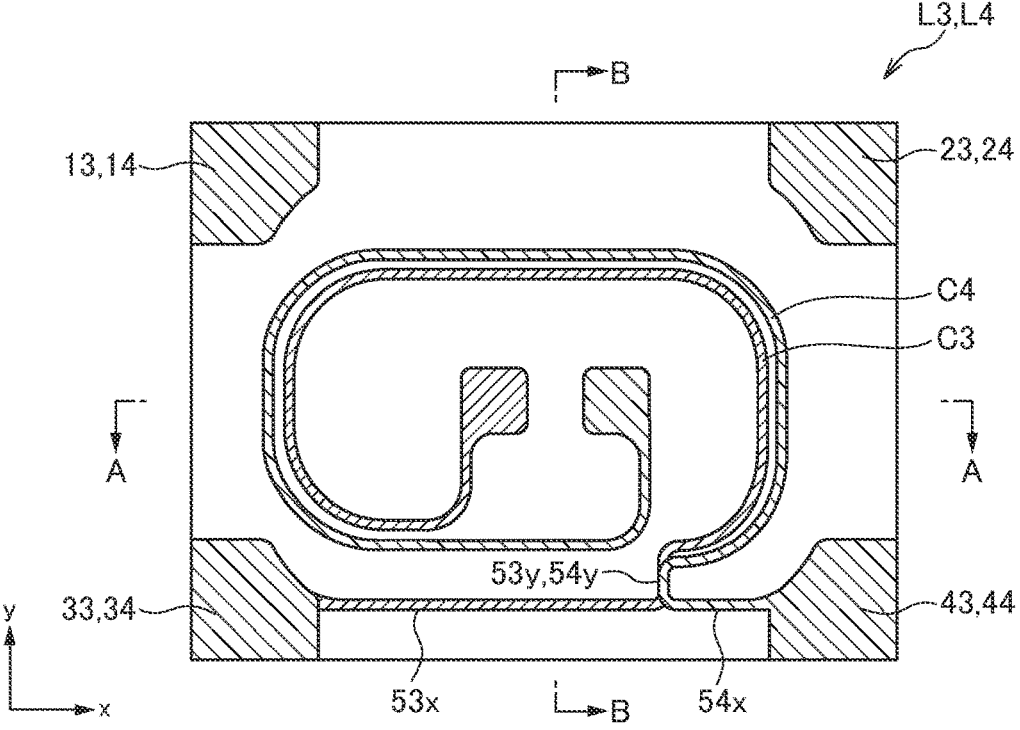
FIG. 12 is a schematic plan view illustrating a state where the conductor layers L3 and L4 overlap each other.
Figure 13:
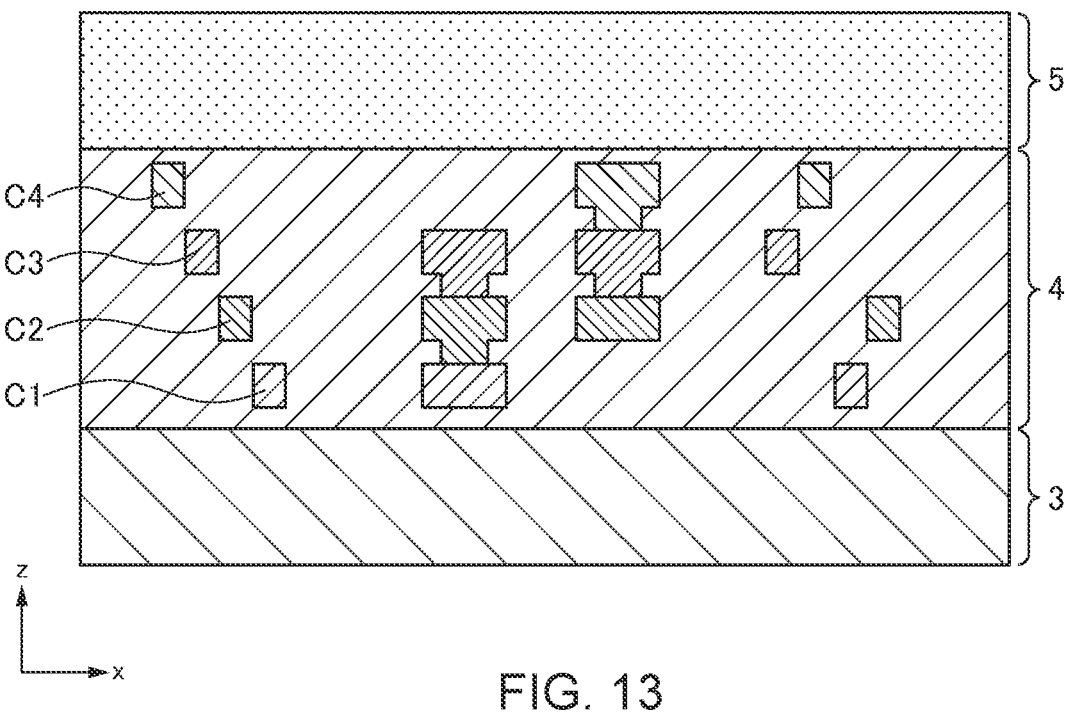
FIG. 13 is a schematic cross-sectional view taken along the line A-A in FIGS. 11 and 12.
Figure 14:
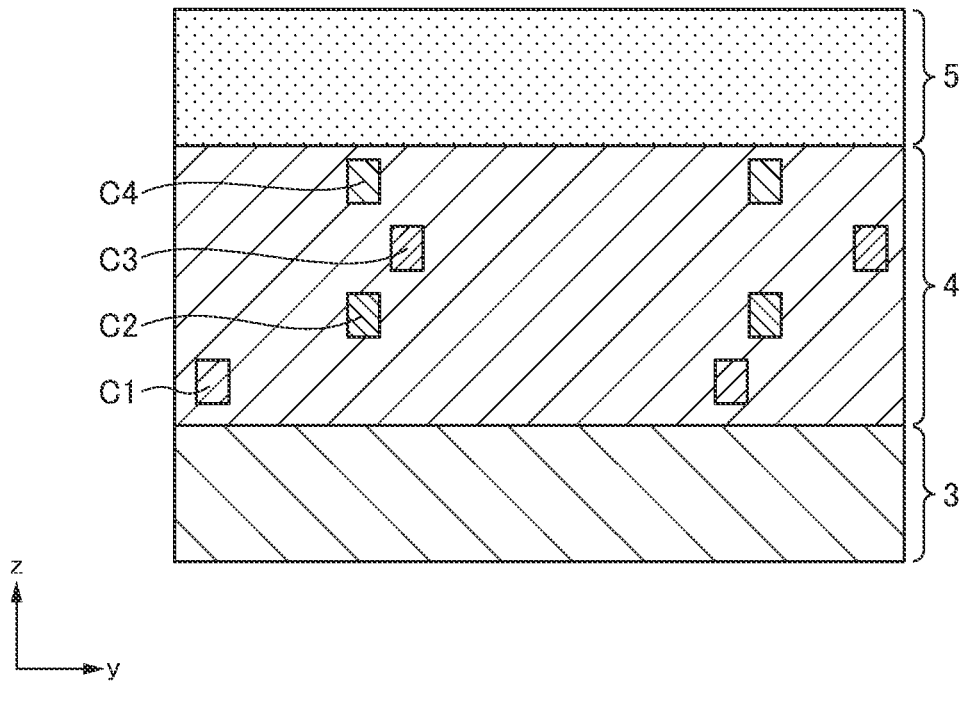
FIG. 14 is a schematic cross-sectional view taken along the line B-B in FIGS. 11 and 12.

FIG. 11 is a schematic plan view illustrating a state where the conductor layers L1 and L2 overlap each other, and FIG. 12 is a schematic plan view illustrating a state where the conductor layers L3 and L4 overlap each other. FIG. 13 is a schematic cross-sectional view taken along the line A-A in FIGS. 11 and 12, and FIG. 14 is a schematic cross-sectional view taken along the line B-B in FIGS. 11 and 12.

As illustrated in FIG. 11, the coil pattern C2 has a large diameter than the coil pattern C1, and the coil patterns C1 and C2 do not overlap each other in the z-direction. The lead-out pattern 51 is longer than the lead-out pattern 52. The section 51y of the lead-out pattern 51 and the section 52y of the lead-out pattern 52 overlap each other in the z-direction, and end portions thereof are connected to the outer peripheral ends of the coil patterns C1 and C2, respectively. The sections 51y and 52y are radially connected to the coil patterns C1 and C2, respectively and do not constitute the coil patterns C1 and C2. That is, the coil patterns C1 and C2 are each constituted by a conductor pattern extending in the peripheral direction. Since the lead-out pattern 51 is longer than the lead-out pattern 52, there occurs a difference in resistance value when the coil patterns C1 and C2 have the same diameter; however, in the present embodiment, the coil pattern C2 has a larger diameter than the coil pattern C1, which cancels the difference in resistance value due to the difference in length between the lead-out patterns 51 and 52. In addition, the coil patterns C1 and C2 do not overlap each other, a stray capacitance generated between the coil patterns C1 and C2 is reduced, with the result that high-frequency characteristics can be improved. Further, when the positions of the coil patterns C1 and C2 are displaced, the coil patterns C1 and C2 approach each other in some section to increase the stary capacitance therebetween, while they separate away from each other to reduce the stray capacitance therebetween, thus suppressing a variation in high-frequency characteristics due to displacement.

The extending direction (positive x-direction) of the section 51x of the lead-out pattern 51 from the connection pattern 11 toward the outer peripheral end of the coil pattern C1 is the same as the winding direction of the coil pattern C1 from the outer peripheral end thereof toward the inner peripheral end of the same, so that magnetic flux generated from the section 51x and magnetic flux generated from the coil pattern C1 strengthen each other. On the other hand, the extending direction (negative x-direction) of the section 52x of the lead-out pattern 52 from the connection pattern 22 toward the outer peripheral end of the coil pattern C2 is opposite to the winding direction of the coil pattern C2 from the outer peripheral end thereof toward the inner peripheral end of the same, so that magnetic flux generated from the section 52x and magnetic flux generated from the coil pattern C2 cancel each other. However, in the present embodiment, the coil pattern C2 is larger in diameter than the coil pattern C1, so that imbalance of inductance is suppressed. The winding direction of the coil pattern C1 from the outer peripheral end thereof toward the inner peripheral end of the same means the extending direction at each position, and it is the positive x-direction in the vicinity of the outer peripheral end of the coil pattern and the negative y-direction in the vicinity of the inner peripheral end of the coil pattern. The winding direction of the coil pattern C2 from the outer peripheral end thereof toward the inner peripheral end of the same is the negative x-direction in the vicinity of the outer peripheral end of the coil pattern and the negative y-direction in the vicinity of the inner peripheral end of the coil pattern. The winding direction of the coil pattern C3 from the outer peripheral end thereof toward the inner peripheral end of the same is the positive x-direction in the vicinity of the outer peripheral end of the coil pattern and the positive y-direction in the vicinity of the inner peripheral end of the coil pattern. The winding direction of the coil pattern C4 from the outer peripheral end thereof toward the inner peripheral end of the same is the negative x-direction in the vicinity of the outer peripheral end of the coil pattern and the positive y-direction in the vicinity of the inner peripheral end of the coil pattern.

Further, assuming that a radial distance between the inner peripheral end of the coil pattern C1 and a position P1 separated from the inner peripheral end of the coil pattern C1 by ½ turn in the outer peripheral direction is φ1 as illustrated in FIG. 2, and a radial distance between the inner peripheral end of the coil pattern C2 and a position P2 separated from the inner peripheral end of the coil pattern C2 by ½ turn in the outer peripheral direction is φ2 as illustrated in FIG. 4, the distance φ2 is larger than the distance φ1. Accordingly, inductance at the innermost turn is larger in the coil pattern C2 than in the coil pattern C1, so that a difference in inductance due to a difference in the length or extending direction between the lead-out patterns 51 and 52 can be reduced. Similarly, as illustrated in FIG. 12, the coil pattern C4 has a larger diameter than the coil pattern C3, and the coil patterns C3 and C4 do not overlap each other in the z-direction. The lead-out pattern 53 is longer than the lead-out pattern 54. The section 53$y$ of the lead-out pattern 53 and the section 54$y$ of the lead-out pattern 54 overlap each other in the z-direction, and end portions thereof are connected to the outer peripheral ends of the coil patterns C3 and C4, respectively. The sections 53$y$ and 54$y$ are radially connected to the coil patterns C3 and C4, respectively and do not constitute the coil patterns C3 and C4. That is, the coil patterns C3 and C4 are each constituted by a conductor pattern extending in the peripheral direction. Since the lead-out pattern 53 is longer than the lead-out pattern 54, there occurs a difference in resistance value when the coil patterns C3 and C4 have the same diameter; however, in the present embodiment, the coil pattern C4 has a larger diameter than the coil pattern C3, which cancels the difference in resistance value due to the difference in length between the lead-out patterns 53 and 54. In addition, the coil patterns C3 and C4 do not overlap each other, a stray capacitance generated between the coil patterns C3 and C4 is reduced, with the result that high-frequency characteristics can be improved. Further, when the positions of the coil patterns C3 and C4 are displaced, the coil patterns C3 and C4 approach each other in some sections to increase the stary capacitance therebetween, while they separate away from each other in other sections to reduce the stray capacitance therebetween, thus suppressing a variation in high-frequency characteristics due to displacement.

The extending direction (positive x-direction) of the section 53$x$ of the lead-out pattern 53 from the connection pattern 33 toward the outer peripheral end of the coil pattern C3 is the same as the winding direction of the coil pattern C3 from the outer peripheral end thereof toward the inner peripheral end of the same, so that magnetic flux generated from the section 53$x$ and magnetic flux generated from the coil pattern C3 strengthen each other. On the other hand, the extending direction (negative x-direction) of the section 54$x$ of the lead-out pattern 54 from the connection pattern 44 toward the outer peripheral end of the coil pattern C4 is opposite to the winding direction of the coil pattern C4 from the outer peripheral end thereof toward the inner peripheral end of the same, so that magnetic flux generated from the section 54$x$ and magnetic flux generated from the coil pattern C4 cancel each other. However, in the present embodiment, the coil pattern C4 is larger in diameter than the coil pattern C3, so that imbalance of inductance is suppressed.

Further, assuming that a radial distance between the inner peripheral end of the coil pattern C3 and a position P3 separated from the inner peripheral end of the coil pattern C3 by ½ turn in the outer peripheral direction is φ3 as illustrated in FIG. 6, and a radial distance between the inner peripheral end of the coil pattern C4 and a position P4 separated from the inner peripheral end of the coil pattern C4 by ½ turn in the outer peripheral direction is φ4 as illustrated in FIG. 8, the distance φ4 is larger than the distance φ3. Accordingly, inductance at the innermost turn is larger in the coil pattern C4 than in the coil pattern C3, so that a difference in inductance due to a difference in the length or extending direction between the lead-out patterns 53 and 54 can be reduced.

Figure 15:
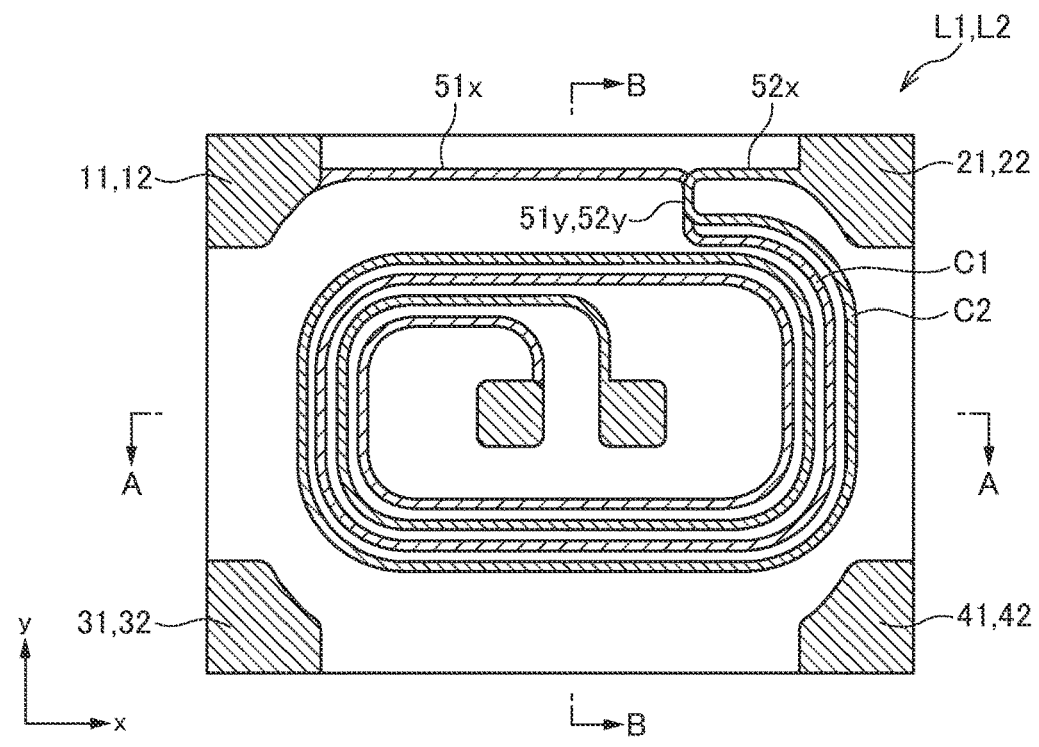
FIG. 15 is a schematic plan view illustrating a state where the conductor layers L1 and L2 overlap each other according to a modification.
Figure 16:
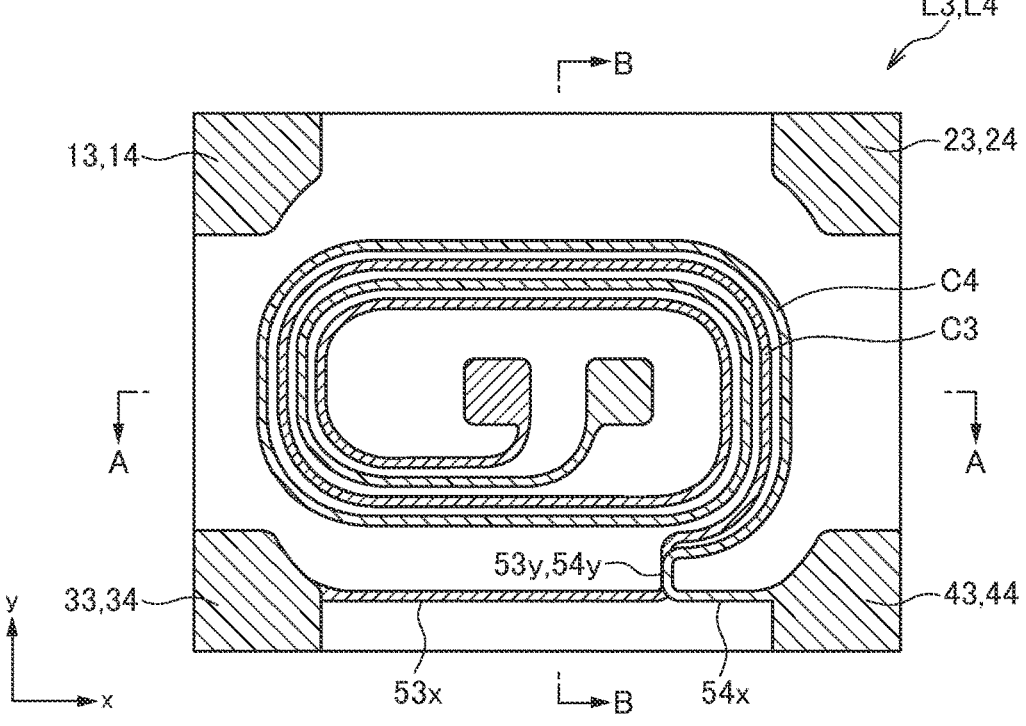
FIG. 16 is a schematic plan view illustrating a state where the conductor layers L3 and L4 overlap each other according to the modification.
Figure 17:
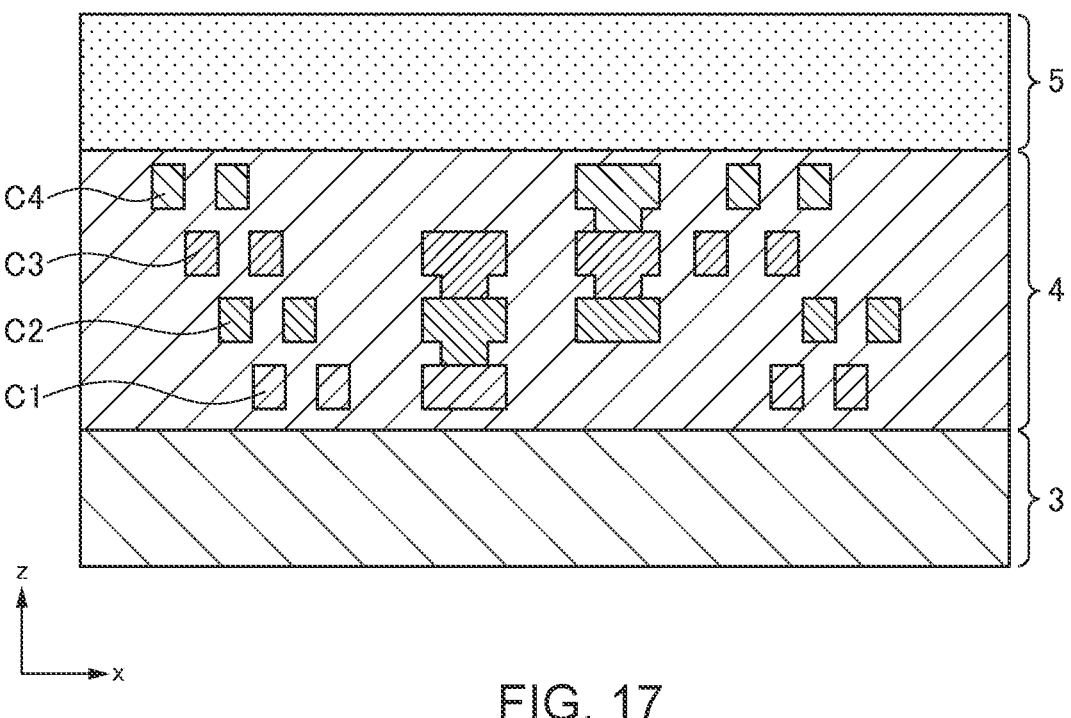
FIG. 17 is a schematic cross-sectional view taken along the line A-A in FIGS. 15 and 16.
Figure 18:
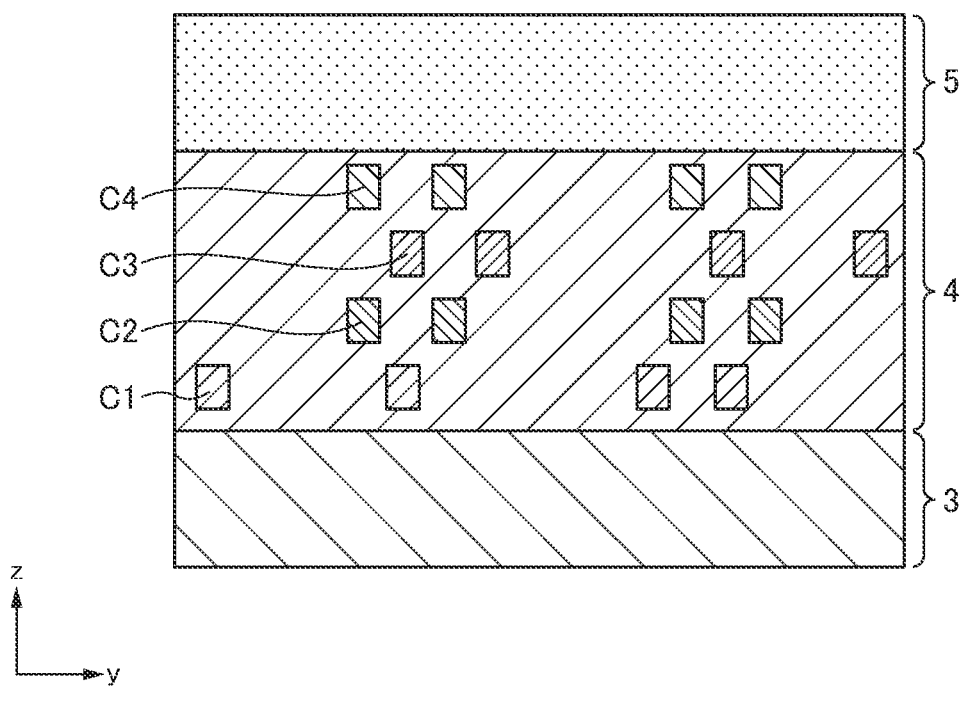
FIG. 18 is a schematic cross-sectional view taken along the line B-B in FIGS. 15 and 16.

FIG. 15 is a schematic plan view illustrating a state where the conductor layers L1 and L2 overlap each other according to a modification, FIG. 16 is a schematic plan view illustrating a state where the conductor layers L3 and L4 overlap each other according to the modification. FIG. 17 is a schematic cross-sectional view taken along the line A-A in FIGS. 15 and 16, and FIG. 18 is a schematic cross-sectional view taken along the line B-B in FIGS. 15 and 16.

As illustrated in FIGS. 15 to 18, the numbers of turns of the coil patterns C1 to C4 included in the respective conductor layers L1 to L4 each need not be one and may be two or more. In such a case, each turn of the coil pattern C2 is larger in diameter than its corresponding turn of the coil pattern C1, and each turn of the coil pattern C4 is larger in diameter than its corresponding turn of the coil pattern C3. Further, it is preferable that none of the turns of the coil patterns C1 and C2 overlap each other in the z-direction as illustrated in FIG. 15 and that none of the turns of the coil patterns C3 and C4 overlap each other in the z-direction as illustrated in FIG. 16.

While the preferred embodiment of the present disclosure has been described, the present disclosure is not limited to the above embodiment, and various modifications may be made within the scope of the present disclosure, and all such modifications are included in the present disclosure.

The technology according to the present disclosure includes the following configuration examples but not limited thereto.

A common mode filter according to the present invention incudes: first and second terminal electrodes; a first conductor layer including a first coil pattern, a first connection pattern connected to the first terminal electrode, and a first lead-out pattern connecting the outer peripheral end of the first coil pattern and the first connection pattern; and a second conductor layer including a second coil pattern, a second connection pattern connected to the second terminal electrode, and a second lead-out pattern connecting the outer peripheral end of the second coil pattern and the second connection pattern. The first and second connection patterns are arranged in a first direction as viewed in the stacking direction of the first and second conductor layers. The winding direction of the first coil pattern from the outer peripheral end thereof toward the inner peripheral end of the same and the winding direction of the second coil pattern from the outer peripheral end thereof toward the inner peripheral end of the same are the same. The first lead-out pattern includes a first section extending in the first direction from the first connection pattern, and the second lead-out pattern includes a second section extending in the first direction from the second connection pattern. The extending direction of the first section from the first connection pattern toward the outer peripheral end of the first coil pattern and the extending direction of the second section from the second connection pattern toward the outer peripheral end of the second coil pattern are opposed to each other. The first section is longer than the second section. The second coil pattern is larger in diameter than the first coil pattern.

According to the present invention, a difference in resistance between lines due to a difference in length between the first section of the first lead-out pattern and the second section of the second lead-out pattern is canceled by a difference in diameter between the first and second coil patterns, thereby making it possible to enhance symmetry between a pair of lines. In addition, since the first and second sections extend in mutually opposite directions, it is possible to reduce a difference in position in a plan view between the outer peripheral end of the first coil pattern and the outer peripheral end of the second coil pattern.

In the present invention, the first and second coil patterns need not necessarily overlap each other in the stacking direction. This reduces a stray capacitance between the first and second coil patterns, improving high-frequency characteristics.

In the present invention, the first lead-out pattern may further include a third section positioned between the first section and the outer peripheral end of the first coil pattern and extending in a second direction perpendicular to the first direction, and the second lead-out pattern may further include a fourth section positioned between the second section and the outer peripheral end of the second coil pattern and extending in the second direction. With this configuration, the positions of the outer peripheral ends of the respective first and second coil patterns can be adjusted depending on the lengths of the respective third and fourth sections. In this case, the third and fourth sections may overlap each other in the stacking direction. This makes it possible to bring the positions in a plan view of the outer peripheral end of the first coil pattern and the outer peripheral end of the second coil pattern closer to each other.

The common mode filter according to the present invention may further include: third and fourth terminal electrodes; a third conductor layer including a third coil pattern whose inner peripheral end is connected to the inner peripheral end of the first coil pattern, a third connection pattern connected to the third terminal electrode, and a third lead-out pattern connecting the outer peripheral end of the third coil pattern and the third connection pattern; and a fourth conductor layer including a fourth coil pattern whose inner peripheral end is connected to the inner peripheral end of the second coil pattern, a fourth connection pattern connected to the fourth terminal electrode, and a fourth lead-out pattern connecting the outer peripheral end of the fourth coil pattern and the fourth connection pattern. The third and fourth connection patterns may be arranged in the first direction as viewed in the stacking direction. The winding direction of the first and second coil patterns from the outer peripheral end thereof toward the inner peripheral end of the same and the winding direction of the third and fourth coil patterns from the inner peripheral end thereof toward the outer peripheral end of the same may be the same. The third lead-out pattern may include a fifth section extending in the first direction from the third connection pattern, and the fourth lead-out pattern may include a sixth section extending in the first direction from the fourth connection pattern. The extending direction of the fifth section from the third connection pattern toward the outer peripheral end of the third coil pattern and the extending direction of the sixth section from the fourth connection pattern toward the outer peripheral end of the fourth coil pattern may be opposed to each other. The fifth section may be longer than the sixth section. The fourth coil pattern may be larger in diameter than the third coil pattern. With this configuration, a difference in resistance between lines due to a difference in length between the fifth section of the third lead-out pattern and the sixth section of the fourth lead-out pattern is canceled by a difference in diameter between the third and fourth coil patterns, thereby making it possible to enhance symmetry between a pair of lines. In addition, since the fifth and sixth sections extend in mutually opposite directions, it is possible to reduce a difference in position in a plan view between the outer peripheral end of the third coil pattern and the outer peripheral end of the fourth coil pattern.

In the present invention, the third and fourth coil patterns need not necessarily overlap each other in the stacking direction. This reduces a stray capacitance between the third and fourth coil patterns, improving high-frequency characteristics.

In the present invention, the third lead-out pattern may further include a seventh section positioned between the fifth section and the outer peripheral end of the third coil pattern and extending in the second direction, and the fourth lead-out pattern may further include an eighth section positioned between the sixth section and the outer peripheral end of the fourth coil pattern and extending in the second direction. With this configuration, the positions of the outer peripheral ends of the respective third and fourth coil patterns can be adjusted depending on the lengths of the respective seventh and eighth sections. In this case, the seventh and eighth sections may overlap each other in the stacking direction. This makes it possible to bring the positions in a plan view of the outer peripheral end of the third coil pattern and the outer peripheral end of the fourth coil pattern closer to each other.

In the present invention, the first and third connection patterns may be arranged in the second direction perpendicular to the first direction as viewed in the stacking direction, and the second and fourth connection patterns may be arranged in the second direction as viewed in the stacking direction. The extending direction of the first section from the first connection pattern toward the outer peripheral end of the first coil pattern may be the same as the winding direction of the first coil pattern from the outer peripheral end thereof toward the inner peripheral end of the same, the extending direction of the second section from the second connection pattern toward the outer peripheral end of the second coil pattern may be opposite to the winding direction of the second coil pattern from the outer peripheral end thereof toward the inner peripheral end of the same, the extending direction of the third section from the third connection pattern toward the outer peripheral end of the third coil pattern may be the same as the winding direction of the third coil pattern from the outer peripheral end thereof toward the inner peripheral end of the same, and the extending direction of the fourth section from the fourth connection pattern toward the outer peripheral end of the fourth coil pattern may be opposite to the winding direction of the fourth coil pattern from the outer peripheral end thereof toward the inner peripheral end of the same. With this configuration, it is possible to suppress imbalance of inductance due to the second and fourth lead-out patterns extending in the opposite directions to the respective second and fourth coil patterns.

In the present invention, assuming that a radial distance between the inner peripheral end of the first coil pattern and a first position separated from the inner peripheral end of the first coil pattern by $\frac{1}{2}$ turn in the outer peripheral direction is a first distance, a radial distance between the inner peripheral end of the second coil pattern and a second position separated from the inner peripheral end of the second coil pattern by $\frac{1}{2}$ turn in the outer peripheral direction is a second distance, a radial distance between the inner peripheral end of the third coil pattern and a third position separated from the inner peripheral end of the third coil pattern by $\frac{1}{2}$ turn in the outer peripheral direction is a third distance, and a radial distance between the inner peripheral end of the fourth coil pattern and a fourth position separated from the inner peripheral end of the fourth coil pattern by ½ turn in the outer peripheral direction is a fourth distance, the second distance may be larger than the first distance, and the fourth distance may be larger than the third distance. This makes it possible to reduce a difference in inductance due to a difference in length between the first and third lead-out patterns and between the second and fourth lead-out patterns.

As described above, according to the present invention, there can be provided a common mode filter with high symmetry between a pair of lines.

What is claimed is:

1. A common mode filter comprising:

first and second terminal electrodes;

a first conductor layer including a first coil pattern, a first connection pattern connected to the first terminal electrode, and a first lead-out pattern connecting an outer peripheral end of the first coil pattern and the first connection pattern; and a second conductor layer including a second coil pattern, a second connection pattern connected to the second terminal electrode, and a second lead-out pattern connecting an outer peripheral end of the second coil pattern and the second connection pattern, wherein the first and second connection patterns are arranged in a first direction as viewed in a stacking direction of the first and second conductor layers, wherein a winding direction of the first coil pattern from the outer peripheral end thereof toward an inner peripheral end thereof and a winding direction of the second coil pattern from the outer peripheral end thereof toward an inner peripheral end thereof are a same, wherein the first lead-out pattern includes a first section extending in the first direction from the first connection pattern, wherein the second lead-out pattern includes a second section extending in the first direction from the second connection pattern, wherein an extending direction of the first section from the first connection pattern toward the outer peripheral end of the first coil pattern and an extending direction of the second section from the second connection pattern toward the outer peripheral end of the second coil pattern are opposed to each other, wherein the first section is longer than the second section, and wherein the second coil pattern is larger in diameter than the first coil pattern.

2. The common mode filter as claimed in claim 1, wherein the first and second coil patterns do not overlap each other in the stacking direction.

3. The common mode filter as claimed in claim 1, wherein the first lead-out pattern further includes a third section positioned between the first section and the outer peripheral end of the first coil pattern and extending in a second direction perpendicular to the first direction, and wherein the second lead-out pattern further includes a fourth section positioned between the second section and the outer peripheral end of the second coil pattern and extending in the second direction.

4. The common mode filter as claimed in claim 3, wherein the third and fourth sections overlap each other in the stacking direction.

5. The common mode filter as claimed in claim 1, further comprising:

third and fourth terminal electrodes;

a third conductor layer including a third coil pattern whose inner peripheral end is connected to the inner peripheral end of the first coil pattern, a third connection pattern connected to the third terminal electrode, and a third lead-out pattern connecting an outer peripheral end of the third coil pattern and the third connection pattern; and a fourth conductor layer including a fourth coil pattern whose inner peripheral end is connected to the inner peripheral end of the second coil pattern, a fourth connection pattern connected to the fourth terminal electrode, and a fourth lead-out pattern connecting an outer peripheral end of the fourth coil pattern and the fourth connection pattern, wherein the third and fourth connection patterns are arranged in the first direction as viewed in the stacking direction, wherein the winding direction of the first and second coil patterns from the outer peripheral end thereof toward the inner peripheral end thereof and a winding direction of the third and fourth coil patterns from the inner peripheral end thereof toward the outer peripheral end thereof are a same, wherein the third lead-out pattern includes a fifth section extending in the first direction from the third connection pattern, wherein the fourth lead-out pattern includes a sixth section extending in the first direction from the fourth connection pattern, wherein an extending direction of the fifth section from the third connection pattern toward the outer peripheral end of the third coil pattern and an extending direction of the sixth section from the fourth connection pattern toward the outer peripheral end of the fourth coil pattern are opposed to each other, wherein the fifth section is longer than the sixth section, and wherein the fourth coil pattern is larger in diameter than the third coil pattern.

6. The common mode filter as claimed in claim 5, wherein the third and fourth coil patterns do not overlap each other in the stacking direction.

7. The common mode filter as claimed in claim 5, wherein the third lead-out pattern further includes a seventh section positioned between the fifth section and the outer peripheral end of the third coil pattern and extending in a second direction perpendicular to the first direction, and the fourth lead-out pattern further includes an eighth section positioned between the sixth section and the outer peripheral end of the fourth coil pattern and extending in the second direction.

8. The common mode filter as claimed in claim 7, wherein the seventh and eighth sections overlap each other in the stacking direction.

9. The common mode filter as claimed in claim 5, wherein the first and third connection patterns are arranged in a second direction perpendicular to the first direction as viewed in the stacking direction, wherein the second and fourth connection patterns are arranged in the second direction as viewed in the stacking direction, wherein an extending direction of the first section from the first connection pattern toward the outer peripheral end of the first coil pattern is a same as an winding direction of the first coil pattern from the outer peripheral end thereof toward the inner peripheral end thereof, wherein an extending direction of the second section from the second connection pattern toward the outer peripheral end of the second coil pattern is opposite to an winding direction of the second coil pattern from the outer peripheral end thereof toward the inner peripheral end thereof, wherein an extending direction of the third section from the third connection pattern toward the outer peripheral end of the third coil pattern is a same as an winding direction of the third coil pattern from the outer peripheral end thereof toward the inner peripheral end thereof, and wherein an extending direction of the fourth section from the fourth connection pattern toward the outer peripheral end of the fourth coil pattern is opposite to an winding direction of the fourth coil pattern from the outer peripheral end thereof toward the inner peripheral end thereof.

10. The common mode filter as claimed in claim 9, wherein a radial distance between the inner peripheral end of the first coil pattern and a first position separated from the inner peripheral end of the first coil pattern by ½ turn in the outer peripheral direction is a first distance, wherein a radial distance between the inner peripheral end of the second coil pattern and a second position separated from the inner peripheral end of the second coil pattern by ½ turn in the outer peripheral direction is a second distance, wherein a radial distance between the inner peripheral end of the third coil pattern and a third position separated from the inner peripheral end of the third coil pattern by ½ turn in the outer peripheral direction is a third distance, wherein a radial distance between the inner peripheral end of the fourth coil pattern and a fourth position separated from the inner peripheral end of the fourth coil pattern by ½ turn in the outer peripheral direction is a fourth distance, wherein the second distance is larger than the first distance, and wherein the fourth distance is larger than the third distance.

\*    \*    \*    \*    \*